US012768887B2

(12) United States Patent
Patil et al.

(10) Patent No.: US 12,768,887 B2
(45) Date of Patent: Oct. 20, 2026

(54) SYSTEM STATE SAVE AND RESTORE MECHANISM USING RAM AND SCAN CHAINS

(71) Applicant: QUALCOMM Incorporated, San Diego, CA (US)

(72) Inventors: Srinivas Patil, Austin, TX (US); Qing Yun Li, San Diego, CA (US); Nir Maor, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 9 days.

(21) Appl. No.: 18/908,670

(22) Filed: Oct. 7, 2024

(65) Prior Publication Data

US 2026/0098900 A1 Apr. 9, 2026

(51) Int. Cl.
*G01R 31/3177* (2006.01)

(52) U.S. Cl.
CPC ................................ *G01R 31/3177* (2013.01)

(58) Field of Classification Search
None
See application file for complete search history.

(56) References Cited

U.S. PATENT DOCUMENTS 4,592,019 A * 5/1986 Huang ...................... G06F 7/78 365/189.08
6,449,709 B1 9/2002 Gates
11,300,614 B1 4/2022 Cron
2004/0153762 A1 * 8/2004 Flynn ................. G06F 11/1407 714/E11.14
2010/0174956 A1 7/2010 Kawasaki et al.

FOREIGN PATENT DOCUMENTS

EP 0167241 A2 1/1986

OTHER PUBLICATIONS

International Search Report and Written Opinion—PCT/US2025/044906—ISA/EPO—Jan. 26, 2026.

* cited by examiner

*Primary Examiner* — Guerrier Merant
(74) *Attorney, Agent, or Firm* — Loza & Loza LLP

(57) ABSTRACT

Aspects of the disclosure are directed to a built-in self test (BIST) mode save and restore operation. In accordance with one aspect, the disclosure includes executing a save directive for an initial state of a digital logic system in an operational mode; executing a built-in self test (BIST) sequence on the digital logic system in a built-in self test (BIST) mode; and executing a restore directive in the digital logic system in the operational mode.

20 Claims, 5 Drawing Sheets

Two sequencing options

- Save_1, Run_LBIST, Restore_1, Save_2, Restore_2
- Save_, Restore_1, Save_2, Run_LBIST, Restore_2

SYSTEM STATE SAVE AND RESTORE MECHANISM USING RAM AND SCAN CHAINS

TECHNICAL FIELD

This disclosure relates generally to the field of automotive electronics systems, and, in particular, to rapid automatic self-testing within an automotive electronics system.

BACKGROUND

Automotive electronics systems may include multiple processing engines, processors or processing cores for a variety of user applications. An automotive electronics system may include a plurality of processing engines along with input/output interfaces, a hierarchy of memory units and associated interconnection databuses. In addition, the automotive electronics system may include a plurality of sensors which communicate with the plurality of processing engines using a plurality of high-speed interfaces. One operational constraint is that the automotive electronics system requires a periodic self-test mode which interrupts an operational mode. Thus, there is a motivation to implement a rapid automatic self-test mode to minimize operational mode timeline impacts.

SUMMARY

The following presents a simplified summary of one or more aspects of the present disclosure, in order to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in a simplified form as a prelude to the more detailed description that is presented later.

In one aspect, the disclosure provides a built-in self test (BIST) mode save and restore operation. Accordingly, the present disclosure discloses an apparatus including: a digital logic system configured to execute digital computation; a processing unit coupled to the digital logic system, the processing unit configured to execute a save directive for an initial state of a digital logic system in an operational mode and configured to execute a restore directive in the digital logic system in the operational mode; and a non-transitory memory coupled to the processing unit, the non-transitory memory configured to store the initial state.

In one example, the non-transitory memory is a last in first out (LIFO) memory. In one example, the digital logic system is a combinatorial circuit. In one example, the digital logic system is a sequential circuit. In one example, the processing unit is further configured to execute a built-in self test (BIST) sequence on the digital logic system in a built-in self test (BIST) mode. In one example, the BIST sequence applies a digital pattern sequence to a plurality of scan chain inputs to obtain a response at a plurality of scan chain outputs.

Another aspect of the disclosure provides an apparatus for providing a built-in self test (BIST) mode save and restore operation and for storing in a non-transitory computer-readable medium, the apparatus including: means for initializing a digital logic system in an operational mode with an initial state; means for executing a save directive for the initial state of the digital logic system in the operational mode; means for transitioning the digital logic system from the operational mode to a built-in self test (BIST) mode; means for executing a BIST sequence on the digital logic system in the BIST mode; means for transitioning the digital logic system from the BIST mode to the operational mode; and means for executing a restore directive in the digital logic system in the operational mode. In one example, the apparatus further includes means for saving the initial state in the non-transitory computer-readable medium.

Another aspect of the disclosure provides a method including: executing a save directive for an initial state of a digital logic system in an operational mode; executing a built-in self test (BIST) sequence on the digital logic system in a built-in self test (BIST) mode; and executing a restore directive in the digital logic system in the operational mode. In one example, the executing the save directive saves the initial state in a memory. In one example, the memory is a last in first out (LIFO) memory.

In one example, the method further includes transitioning the digital logic system from the operational mode to the BIST mode. In one example, the method further includes transitioning the digital logic system from the BIST mode to the operational mode. In one example, the method further includes initializing the digital logic system in the operational mode with the initial state. In one example, the method further includes selecting the operational mode by using a control line to select a first multiplexer input state.

In one example, the BIST sequence applies a digital pattern sequence to a plurality of scan chain inputs to obtain a response at a plurality of scan chain outputs. In one example, the response is compared to a predetermined reference response to generate a comparison, and wherein the comparison is used for fault detection in the digital logic system. In one example, the restore directive restores the initial state to the digital logic system. In one example, the restore directive restores a mirrored version of the initial state to the digital logic system. In one example, the method further includes recovering the initial state from the mirrored version of the initial state by executing the save directive and the restore directive a second time.

These and other aspects of the present disclosure will become more fully understood upon a review of the detailed description, which follows. Other aspects, features, and implementations of the present disclosure will become apparent to those of ordinary skill in the art, upon reviewing the following description of specific, exemplary implementations of the present invention in conjunction with the accompanying figures. While features of the present invention may be discussed relative to certain implementations and figures below, all implementations of the present invention can include one or more of the advantageous features discussed herein. In other words, while one or more implementations may be discussed as having certain advantageous features, one or more of such features may also be used in accordance with the various implementations of the invention discussed herein. In similar fashion, while exemplary implementations may be discussed below as device, system, or method implementations it should be understood that such exemplary implementations can be implemented in various devices, systems, and methods.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

While for purposes of simplicity of explanation, the methodologies are shown and described as a series of acts, it is to be understood and appreciated that the methodologies are not limited by the order of acts, as some acts may, in accordance with one or more aspects, occur in different orders and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with one or more aspects.

Figure 1:
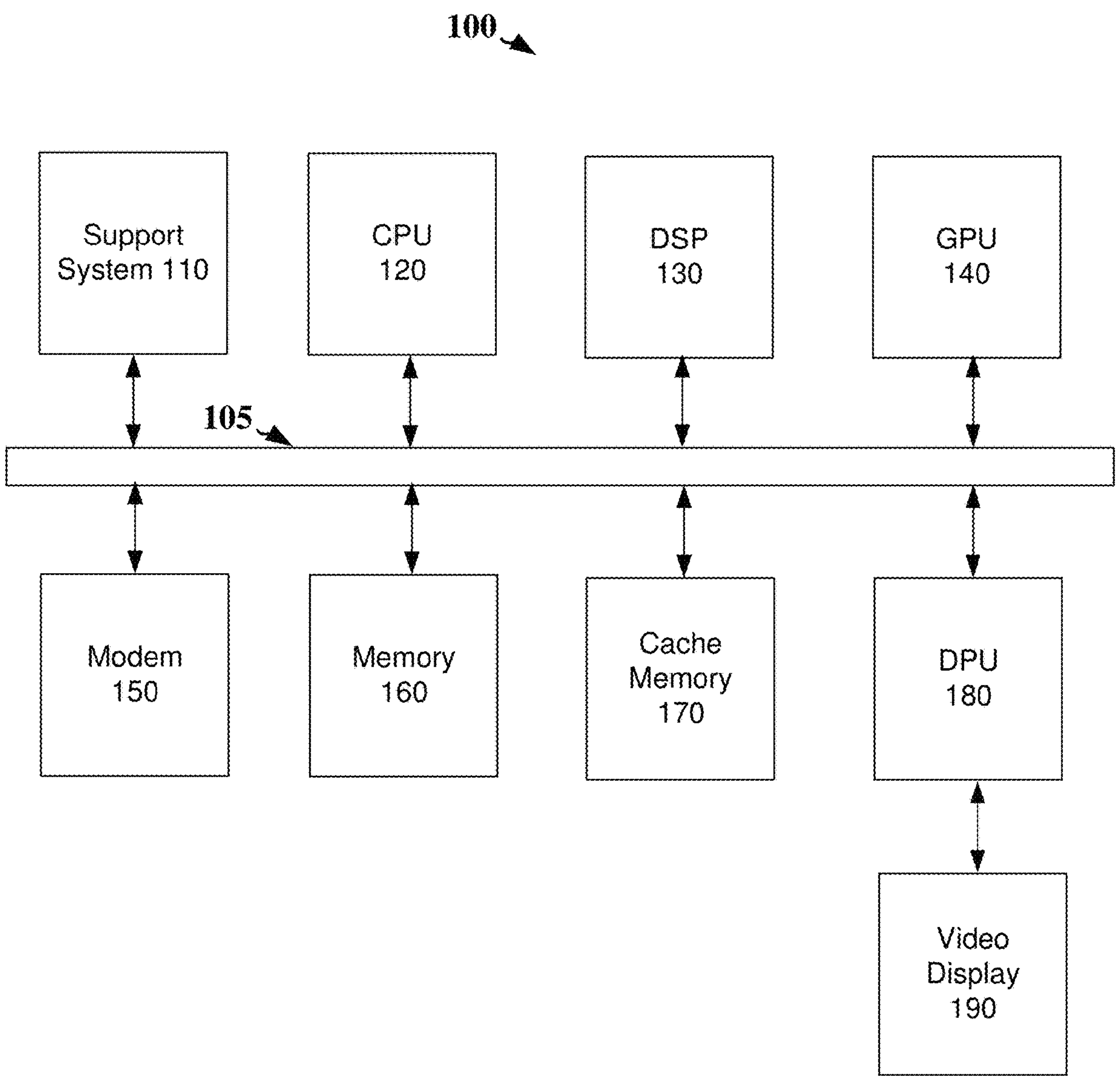
FIG. 1 illustrates an example information processing system for automotive electronics.

FIG. 1 illustrates an example information processing system for automotive electronics 100. In one example, the information processing system 100 includes a plurality of processing engines such as a central processing unit (CPU) 120, a digital signal processor (DSP) 130, a graphics processing unit (GPU) 140, a display processing unit (DPU) 180, etc. In one example, various other functions in the information processing system 100 may be included such as a support system 110, a modem 150, a memory 160, a cache memory 170 and a video display 190. For example, the plurality of processing engines and various other functions may be interconnected by an interconnection databus 105 to transport data and control information. In one example, the CPU 120 may serve as a controller or a microcontroller of other processing engines. In one example, the controller or microcontroller may reallocate tasks from one processing engine to another.

In one example, the memory 160 and/or the cache memory 170 may be shared among the CPU 120, the GPU 140 and the other processing engines. In one example, the CPU 120 may include a first internal memory which is not shared with the other processing engines. In one example, the GPU 140 may include a second internal memory which is not shared with the other processing engines. In one example, any processing engine of the plurality of processing engines may have an internal memory (i.e., a dedicated memory) which is not shared with the other processing engines. Although several components of the information processing system 100 are included herein, one skilled in the art would understand that the components listed herein are examples and are not exclusive. Thus, other components may be included as part of the information processing system 100 within the spirit and scope of the present disclosure.

In one example, one or more processing engines in the information processing system 100 may be aggregated into a single integrated circuit known as a system on a chip (SOC). In one example, the SOC may include the central processing unit (CPU) 120 and other processing engines such as the DSP 130 or the GPU 140. The SOC may also include the memory 160 and the cache memory 170.

In one example, an automobile includes a system test and diagnostics mechanism, for example, a built-in self test (BIST) mode. One motivation for the system test and diagnostic mechanism is compliance with an international automotive safety standard, ISO 26262 (Road vehicles—Functional safety) which provides guidelines for automotive safety requirements, including diagnostic testing. Typically, the BIST mode is interleaved with an operational mode. Hence, there is a strong motivation to minimize the BIST mode timeline impact on the operational mode.

The system test and diagnostic mechanism may be in at least two forms: a software test library (STL) or a built-in self test (BIST) mode. For example, the STL includes software code which exercises certain design features to attain high fault coverage. For example, the BIST mode employs on-die digital pattern generators and response compactors/comparators for logic circuits and memory circuits. For example, the BIST mode tests a design using the on-die digital pattern generators and response compactors/comparators. For example, there are two types of BIST: a memory BIST (MBIST) to test a memory circuit and a logic BIST (LBIST) to test a logic circuit. For example, the on-die digital pattern generator is a pseudo-random pattern generator which generates a pseudo-random pattern (i.e., a random-like digital sequence based on a deterministic process).

In one example, there are a plurality of in-system test scenarios. For example, a first test scenario operates for power on (PON) and power off (POF) phases during the BIST mode. For example, a second test scenario operates on demand where selected subsystems may be put in an offline state during a mission mode by software to execute a BIST. For example, a third test scenario operates periodically during the mission mode and may be implemented using the STL due to BIST limitations.

In one example, for the STL, software code may be run in a mission mode frequency. For example, the software code may execute with minimal test time and minimal disruption to mission mode operations. In one example, the STL may have limited fault coverage and may have limited automation to improve fault coverage.

In one example, for the BIST mode, predictable and pervasive fault coverage may be available. For example, the BIST mode may corrupt a system state which may cause a processor reset and result in a delayed recovery. Thus, an augmented BIST mode which provides a more robust capability is desired.

In one example, the BIST mode may include a plurality of scan chains. For example, the BIST mode may apply a digital test pattern (e.g., using a PRPG) to a device under test (DUT) input and then compare a response at the DUT output to a predetermined reference response. The comparison may be used for fault detection in the DUT. In one example, the response may be compacted into a digital signature (i.e., a digest).

Figure 2:
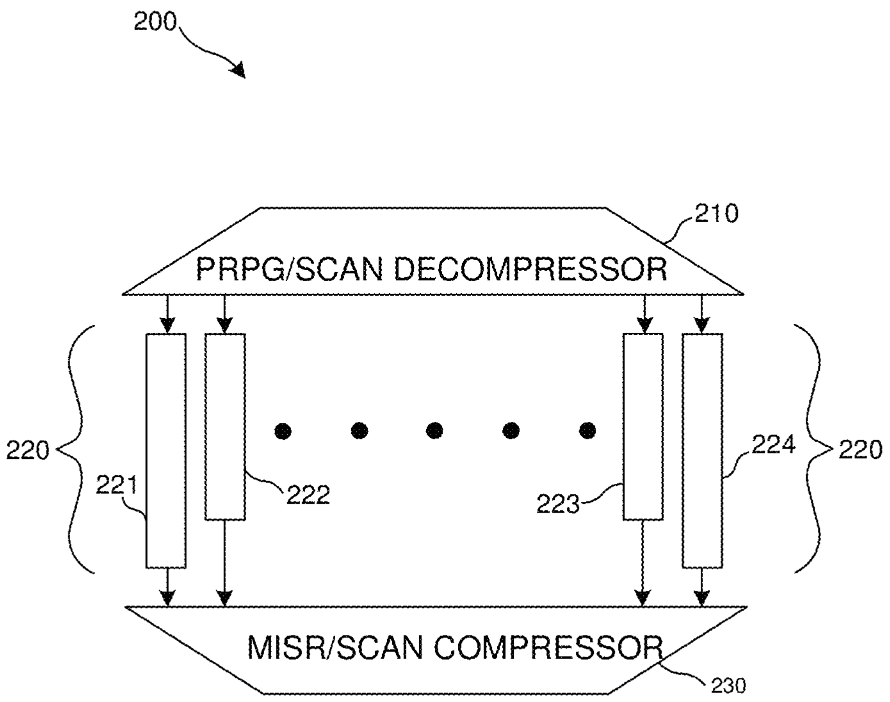
FIG. 2 illustrates a first example implementation of a plurality of scan chains for a built-in self test (BIST) mode.

FIG. 2 illustrates a first example implementation of a plurality of scan chains for a built-in self test (BIST) mode 200. In one example, the first example implementation of the plurality of scan chains 200 includes a pseudo random pattern generator (PRPG) and scan decompressor 210, a plurality of scan chains 220 and a multiple input signature register (MISR) and scan compressor 230. In one example, the plurality of scan chains 220 is part of a design for test (DFT) methodology for combinational logic in a digital logic system. For example, the plurality of scan chains 220 may be used to interrogate internal states of the combinational logic being tested. In one example, the combinational logic may be in an operational mode or in a BIST mode.

In one example, the PRPG and scan decompressor 210 provide a first pseudo random sequence 211 (i.e., a random-like digital sequence based on a deterministic process) and a processing capability to recover original scan data from a compressed scan data. In one example, the first pseudo random sequence is distributed to a plurality of scan chains 220 with a first scan chain 221, a second scan chain 222, and so on until an (N−1)th scan chain 223 and an Nth scan chain 224. In one example, the plurality of scan chains 220 generate a first plurality of output sequences 260 using the first pseudo random sequence 211 as input. In one example, each scan chain of the plurality of scan chains 220 is a hardware monitoring circuit to provide diagnostic measurements of logical states of a digital logic system. For example, each scan chain may include a plurality of flip flops configured as a plurality of shift registers.

In one example, the MISR and scan compressor 230 accept the first plurality of output sequences 260 from the plurality of scan chains 220 and derive a first digital signature from the first plurality of output sequences 260 to compare against a reference digital signature. For example, the first digital signature serves as a digest (i.e., compact representation) of the first plurality of output sequences 260. In one example, the MISR and scan compressor 230 provides a processing capability to compress (i.e., source encode) the first plurality of output sequences 260.

Figure 3:
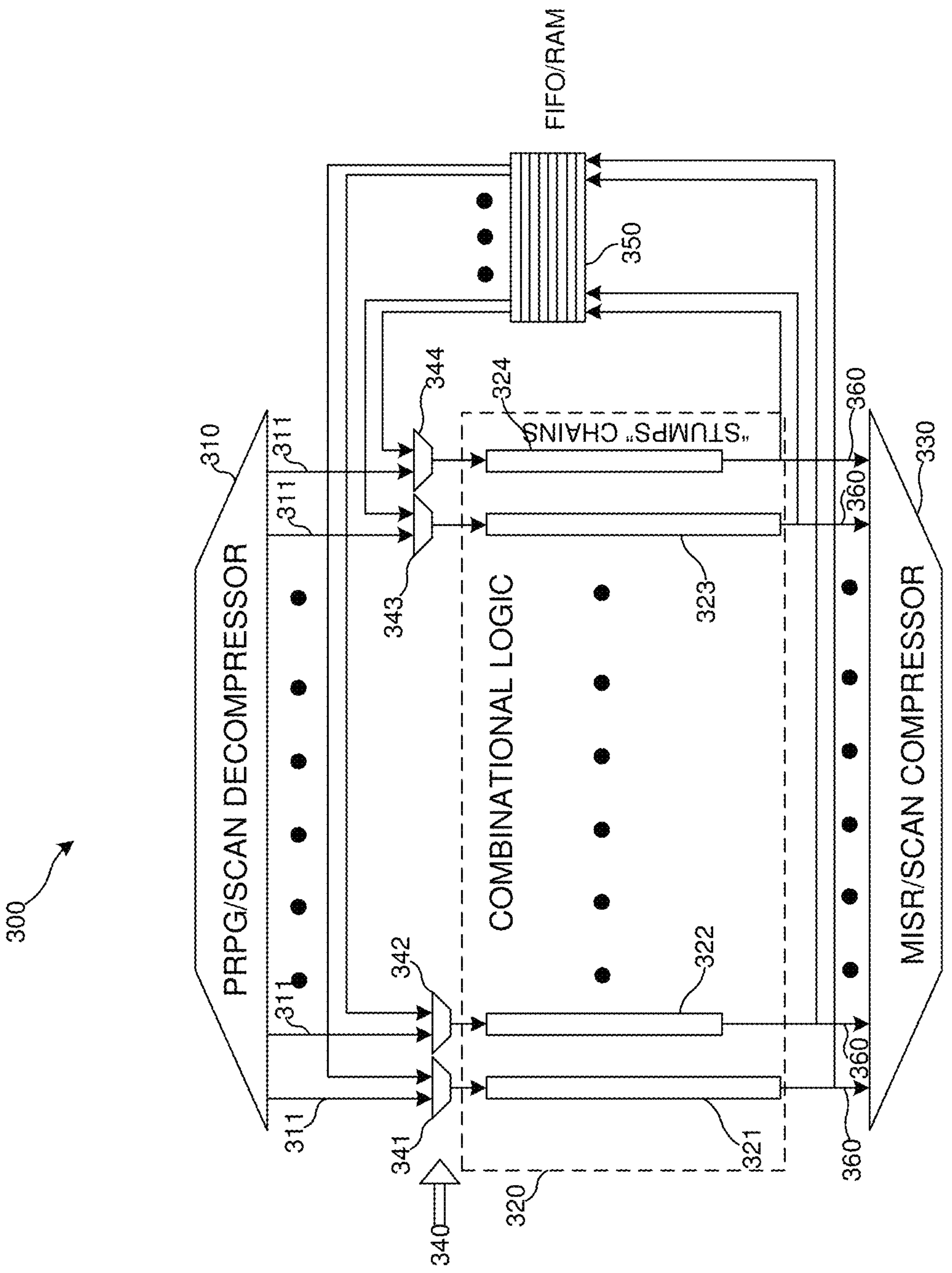
FIG. 3 illustrates a second example implementation of a plurality of scan chains for a built-in self test (BIST) mode.

FIG. 3 illustrates a second example implementation of a plurality of scan chains for a built-in self test (BIST) mode 300. In one example, the second implementation 300 is for an augmented BIST mode (i.e., an extended version of the BIST mode 200 in FIG. 2). In one example, the second implementation of the plurality of scan chains 300 includes a pseudo random pattern generator (PRPG) and scan decompressor 310, a plurality of scan chains 320 and a multiple input signature register (MISR) and scan compressor 330. In one example, the plurality of scan chains 320 is part of a design for test (DFT) methodology for combinational logic in a digital logic system. For example, the plurality of scan chains 320 may be used to interrogate internal states of the combinational logic being tested. In one example, the combinational logic may be in an operational mode or in a BIST mode.

In one example, the PRPG and scan decompressor 310 provide a second pseudo random sequence 311 (i.e., a random-like digital sequence based on a deterministic process) and a processing capability to recover original scan data from a compressed scan data. In one example, the second pseudo random sequence is distributed to the plurality of scan chains 320 with a first scan chain 321, a second scan chain 322, and so on until an (N−1)th scan chain 323 and an Nth scan chain 324. In one example, the plurality of scan chains 320 generate a second plurality of output sequences 360 using the second pseudo random sequence 311 as input. In one example, each scan chain of the plurality of scan chains 320 is a hardware monitoring circuit to provide diagnostic measurements of logical states of a digital logic system. For example, each scan chain may include a plurality of flip flops configured as a plurality of shift registers.

In one example, the MISR and scan compressor 330 accept the second plurality of output sequences 360 from the plurality of scan chains 320 and derive a second digital signature from the second plurality of output sequences 360 to compare against a reference digital signature. For example, the second digital signature serves as a digest (i.e., compact representation) of the second plurality of output sequences 360. In one example, the MISR and scan compressor 330 provides a processing capability to compress (i.e., source encode) the second plurality of output sequences 360.

In one example, the second implementation of a plurality of scan chains 300 includes a random access memory (RAM) 350 which stores the second plurality of output sequences 360 as a memory input. For example, the RAM 350 is a first in first out (FIFO) memory. In one example, FIFO means the first word written into memory is the first word read out of the memory. In one example, the RAM 350 may be replaced by a flip flop circuit. In one example, the RAM 350 may be a last in first out (LIFO) memory.

In one example, the RAM 350 provides the second plurality of output sequences 360 as a first plurality of multiplexer inputs to a plurality of multiplexers 340. In one example, the second pseudo random sequence 311 is a second plurality of multiplexer inputs to the plurality of multiplexers 340. In one example, the first plurality of multiplexer inputs is selected in BIST mode and the second plurality of multiplexer inputs is selected in operational mode. In one example, the multiplexer input selection is performed using a control line which is sourced by a controller (not shown).

In one example, internal states (e.g., flip flop states) of the combinational logic in the operational mode are sent to the RAM 350 for storage prior to transitioning to a BIST mode. In one example, the stored internal states are retrieved from the RAM 350 and returned to the combinational logic upon completion of the BIST mode. In one example, incorporation of the RAM 350 and the plurality of multiplexers 340 at the input of the plurality of scan chains 320 maintains the structure and functionality of the combinational logic. In one example, usage of the RAM 350 to store internal states of the operational mode prior to entering the BIST mode allows a rapid restoration of the operational mode after completion of the BIST mode.

In one example, the RAM 350 has a memory width equal to the number of scan chains in the plurality of scan chains 320. In one example, each scan chain of the plurality of scan chains has a different quantity of stages (i.e., length). In one example, the RAM 350 has a memory depth (i.e., number of memory entries) equal to the quantity of stages of the scan chain with the greatest length (i.e., highest quantity of stages) of the plurality of scan chains 320. For example, improved efficiency may be attained by equalizing the quantity of stages across each scan chain (i.e., minimizing differences in lengths among the plurality of scan chains).

In one example, there are several alternative architectures which may reduce routing congestion and packet delay (PD). In one example, the RAM 350 may be decomposed into a plurality of smaller RAMs such that each smaller RAM may be distributed nearer each scan chain. In one example, the RAM 350 may have a memory width smaller than the number of scan chains in the plurality of scan chains 320 along with an aggregation scheme. In one example, the aggregation scheme may aggregate each scan chain output using serial-to-parallel conversion prior to RAM storage. In one example, the aggregation scheme may de-aggregate each scan chain input using parallel-to-serial conversion subsequent to RAM storage. In one example, the aggregation scheme may use time division multiplexing (TDM) to aggregate several scan chain outputs into one time slot prior to RAM storage. In one example, the aggregation scheme may use time division de-multiplexing to de-aggregate the one time slot into several scan chain inputs subsequent to RAM storage. For example, a memory clock frequency may be scaled according to the aggregation scheme. For example, 128 scan chains operating at 125 MHz may be captured into RAM storage with a 32 bit RAM running at 500 MHz.

In one example, the BIST mode is applicable to both a logical BIST mode and an automatic test pattern generator (ATPG). In one example, each scan chain is unidirectional such that proper sequencing is required for internal state restoration.

Figure 4:
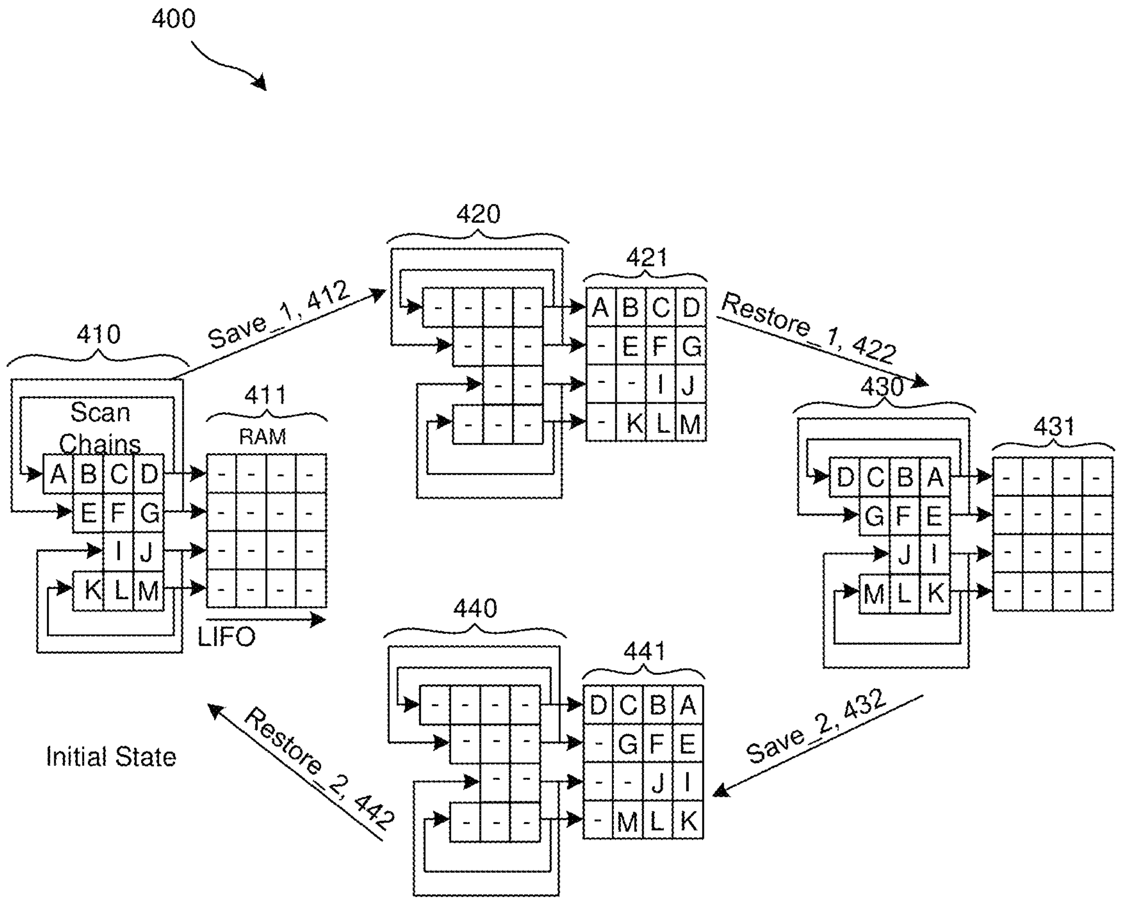
FIG. 4 illustrates an example random access memory (RAM) save and restore sequence.

FIG. 4 illustrates an example random access memory (RAM) save and restore sequence 400. In one example, the RAM save and restore sequence 400 includes a RAM which is a last in first out (LIFO) memory. In one example, the RAM may be a first in first out (FIFO) memory. In one example, LIFO means the last word written into memory is the first word read out of memory. In one example, a first scan chain state 410 in a plurality of scan chains exists with a first RAM state 411. In one example, the first scan chain state 410 is an initial configuration of the plurality of scan chains. In one example, the first RAM state 411 is a null state (i.e., empty). In one example, the first scan chain state 410 is an original state of the plurality of scan chains.

Upon execution of a first save directive 412, the plurality of scan chains transitions to a second scan chain state 420 with a second RAM state 421. In one example, the second chain state 420 is a second configuration of the plurality of scan chains. In one example, the second RAM state 421 stores a copy of the first scan chain state 410 in memory. In one example, the second scan chain state 420 is a null state (i.e., empty).

Upon execution of a first restore directive 422, the plurality of scan chains transitions to a third scan chain state 430 with a third RAM state 431. In one example, the third chain state 430 is a third configuration of the plurality of scan chains and is a mirrored replica of the first configuration (i.e., a mirrored version of the first chain state 410). In one example, the third RAM state 431 is a null state (i.e., empty). In one example, the third scan chain state 430 recovers the first chain state 410 in a mirrored form (e.g., a sequence ABCD is recovered as DCBA).

Upon execution of a second save directive 432, the plurality of scan chains transitions to a fourth scan chain state 440 with a fourth RAM state 441. In one example, the fourth chain state 440 is a fourth configuration of the plurality of scan chains and is a null state (i.e., empty). In one example, the fourth RAM state 441 is a mirrored replica of the second RAM state 421.

Upon execution of a second restore directive 442, the plurality of scan chains transitions to a fifth scan chain state 450 (not shown) with a fifth RAM state 451 (not shown). In one example, the fifth chain state 450 is a fifth configuration of the plurality of scan chains and is the same as the first configuration. In one example, the fifth RAM state 431 is the same as first RAM state 411 which is a null state (i.e., empty). That is, with two cycles of a save directive and a restore directive, the state of the plurality of scan chains is restored to the original state. For example, two cycles are needed due to a unidirectional shift of contents of the plurality of scan chains.

In one example, a first BIST directive may execute a BIST mode immediately after the execution of the first save directive 412. That is, a first directive sequence may be: first save directive, run BIST mode directive, first restore directive, second save directive, second restore directive. In one example, a second BIST directive may execute a BIST mode immediately after the execution of the second save directive 432. That is, a second directive sequence may be: first save directive, first restore directive, second save directive, run BIST mode directive, second restore directive.

Figure 5:
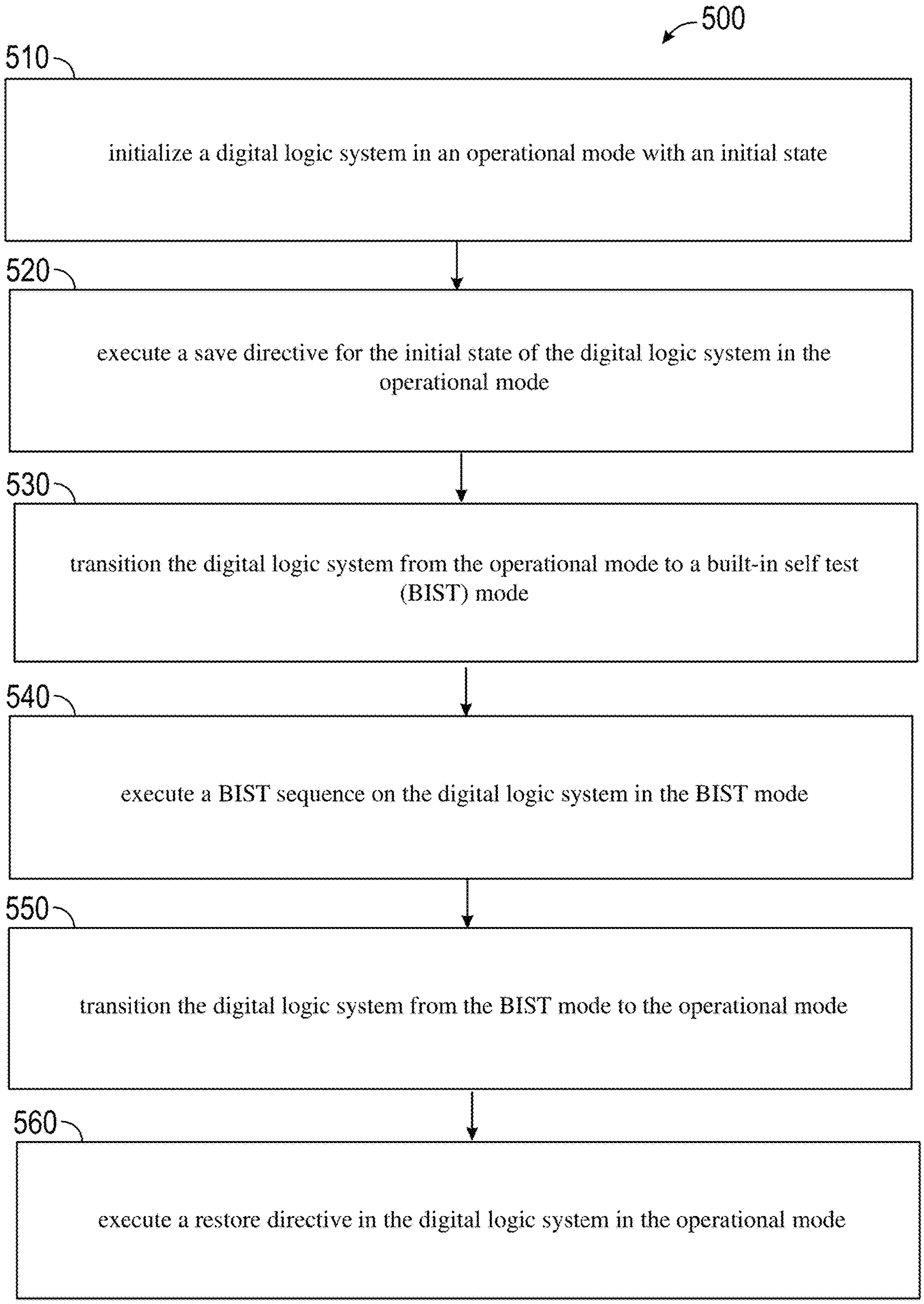
FIG. 5 illustrates an example flow diagram for implementing a BIST mode save and restore operation.

FIG. 5 illustrates an example flow diagram 500 for implementing a BIST mode save and restore operation. In block 510, initialize a digital logic system in an operational mode with an initial state. In one example, a digital logic system is initialized in an operational mode with an initial state. In one example, the digital logic system is a combinatorial circuit. In one example, the digital logic system is a sequential circuit. In one example, the initial state is an initial configuration of state variables of the digital logic system. For example, state variables are combinatorial circuit output values. In one example, the operational mode is selected by using a control line to select a first multiplexer input state. In one example, the first multiplexer input state is selected by a controller. In one example, the first multiplexer input state connects a plurality of scan chain inputs to a plurality of outputs from a local memory. In one example, the local memory is a random access memory (RAM). In one example, the local memory is a plurality of RAMs. In one example, the step of block 510 is performed by a processing engine, a controller, a central processing unit (CPU), a display processing unit, (DPU), a microcontroller, a microprocessor, etc.

In block 520, execute a save directive for the initial state of the digital logic system in the operational mode. In one example, a save directive is executed for the initial state of the digital logic system in the operational mode. In one example, the save directive is a first save directive, and executing the first save directive saves the initial state in a memory, for example, a non-transitory memory. In one example, the memory is a random access memory (RAM). In one example, the memory is a last in first out (LIFO) memory. In one example, the memory has a memory width equal to a number of scan chains in a plurality of scan chains. In one example, the memory has a memory width less than the number of scan chains in the plurality of scan chains. In one example, the memory has a memory depth (i.e., number of memory entries) equal to the quantity of stages of the scan chain with the greatest length (i.e., highest quantity of stages) of the plurality of scan chains. In one example, the step of block 520 is performed by a processing engine, a controller, a central processing unit (CPU), a display processing unit, (DPU), a microcontroller, a microprocessor, etc.

In block 530, transition the digital logic system from the operational mode to a built-in self test (BIST) mode. In one example, the digital logic system is transitioned from the operational mode to a built-in self test (BIST) mode. In one example, the BIST mode is selected by using the control line to select a second multiplexer input state. In one example, the second multiplexer input state is selected by a controller. In one example, the second multiplexer input state connects the plurality of scan chain inputs to a digital pattern sequence generator. In one example, the digital pattern sequence generator is a pseudo random pattern generator (PRPG). In one example, the second multiplexer input state connects the plurality of scan chain inputs to a scan decompressor. In one example, the step of block 530 is performed by a processing engine, a controller, a central processing unit (CPU), a display processing unit, (DPU), a microcontroller, a microprocessor, etc.

In block 540, execute a BIST sequence on the digital logic system in the BIST mode. In one example, a BIST sequence is executed on the digital logic system in the BIST mode. In one example, the BIST sequence applies a digital pattern sequence to the plurality of scan chain inputs to obtain a response at a plurality of scan chain outputs. In one example, the response is compared to a predetermined reference response. In one example, the response may be compacted into a digital signature (i.e., a digest). In one example, the comparison may be used for fault detection in the digital logic system. In one example, the step of block 540 is performed by a processing engine, a controller, a central processing unit (CPU), a display processing unit, (DPU), a microcontroller, a microprocessor, etc.

In block 550, transition the digital logic system from the BIST mode to the operational mode. In one example, the digital logic system is transitioned from the BIST mode to the operational mode. In one example, the operational mode is selected by using the control line to select the first multiplexer input state. In one example, the step of block 550 is performed by a processing engine, a controller, a central processing unit (CPU), a display processing unit, (DPU), a microcontroller, a microprocessor, etc.

In block 560, execute a restore directive in the digital logic system in the operational mode. In one example, a restore directive is executed in the digital logic system in the operational mode. In one example, the restore directive restores the initial state to the digital logic system. In one example, the restore directive restores a mirrored version of the initial state to the digital logic system. In one example, the initial state may be recovered from the mirrored version of the initial state by executing the save directive and the restore directive a second time. In one example, the step of block 560 is performed by a processing engine, a controller, a central processing unit (CPU), a display processing unit, (DPU), a microcontroller, a microprocessor, etc.

In one aspect, one or more of the steps for providing a built-in self test (BIST) mode save and restore operation in FIG. 5 may be executed by one or more processors which may include hardware, software, firmware, etc. The one or more processors, for example, may be used to execute software or firmware needed to perform the steps in the flow diagram of FIG. 5. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise.

The software may reside on a computer-readable medium. The computer-readable medium may be a non-transitory computer-readable medium. A non-transitory computer-readable medium includes, by way of example, a magnetic storage device (e.g., hard disk, floppy disk, magnetic strip), an optical disk (e.g., a compact disc (CD) or a digital versatile disc (DVD)), a smart card, a flash memory device (e.g., a card, a stick, or a key drive), a random access memory (RAM), a read only memory (ROM), a programmable ROM (PROM), an erasable PROM (EPROM), an electrically erasable PROM (EEPROM), a register, a removable disk, and any other suitable medium for storing software and/or instructions that may be accessed and read by a computer. The computer-readable medium may also include, by way of example, a carrier wave, a transmission line, and any other suitable medium for transmitting software and/or instructions that may be accessed and read by a computer. The computer-readable medium may reside in a processing system, external to the processing system, or distributed across multiple entities including the processing system. The computer-readable medium may be embodied in a computer program product. By way of example, a computer program product may include a computer-readable medium in packaging materials. The computer-readable medium may include software or firmware. Those skilled in the art will recognize how best to implement the described functionality presented throughout this disclosure depending on the particular application and the overall design constraints imposed on the overall system.

Any circuitry included in the processor(s) is merely provided as an example, and other means for carrying out the described functions may be included within various aspects of the present disclosure, including but not limited to the instructions stored in the computer-readable medium, or any other suitable apparatus or means described herein, and utilizing, for example, the processes and/or algorithms described herein in relation to the example flow diagram.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another-even if they do not directly physically touch each other. The terms "circuit" and "circuitry" are used broadly, and intended to include both hardware implementations of electrical devices and conductors that, when connected and configured, enable the performance of the functions described in the present disclosure, without limitation as to the type of electronic circuits, as well as software implementations of information and instructions that, when executed by a processor, enable the performance of the functions described in the present disclosure.

One or more of the components, steps, features and/or functions illustrated in the figures may be rearranged and/or combined into a single component, step, feature or function or embodied in several components, steps, or functions. Additional elements, components, steps, and/or functions may also be added without departing from novel features disclosed herein. The apparatus, devices, and/or components illustrated in the figures may be configured to perform one or more of the methods, features, or steps described herein. The novel algorithms described herein may also be efficiently implemented in software and/or embedded in hardware.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for."

One skilled in the art would understand that various features of different embodiments may be combined or modified and still be within the spirit and scope of the present disclosure.

What is claimed is:

1. An apparatus comprising:

a digital logic system configured to execute digital computation;

a processing unit coupled to the digital logic system, the processing unit configured to execute a save directive for an initial state of a digital logic system in an operational mode and configured to execute a restore directive of a captured state in the digital logic system in the operational mode, wherein the captured state is a reversed version of the initial state; and a non-transitory memory coupled to the processing unit, the non-transitory memory configured to store the initial state.

2. The apparatus of claim 1, wherein the non-transitory memory is a last in first out (LIFO) memory.

3. The apparatus of claim 2, wherein the digital logic system is a combinatorial circuit.

4. The apparatus of claim 2, wherein the digital logic system is a sequential circuit.

5. The apparatus of claim 2, wherein the processing unit is further configured to execute a built-in self test (BIST) sequence on the digital logic system in a built-in self test (BIST) mode.

6. The apparatus of claim 5, wherein the BIST sequence applies a digital pattern sequence to a plurality of scan chain inputs to obtain a response at a plurality of scan chain outputs.

7. An apparatus for providing a built-in self test (BIST) mode save and restore operation and for storing in a non-transitory computer-readable medium, the apparatus comprising:

means for initializing a digital logic system in an operational mode with an initial state;

means for executing a save directive for the initial state of the digital logic system in the operational mode;

means for transitioning the digital logic system from the operational mode to a built-in self test (BIST) mode;

means for executing a BIST sequence on the digital logic system in the BIST mode;

means for transitioning the digital logic system from the BIST mode to the operational mode; and means for executing a restore directive of a captured state in the digital logic system in the operational mode, wherein the captured state is a reversed version of the initial state.

8. The apparatus of claim 7, further comprising means for saving the initial state in the non-transitory computer-readable medium.

9. A method comprising:

executing a save directive for an initial state of a digital logic system in an operational mode;

executing a built-in self test (BIST) sequence on the digital logic system in a built-in self test (BIST) mode; and executing a restore directive of a captured state in the digital logic system in the operational mode, wherein the captured state is a reversed version of the initial state.

10. The method of claim 9, wherein the executing the save directive saves the initial state in a memory.

11. The method of claim 10, wherein the memory is a last in first out (LIFO) memory.

12. The method of claim 9, further comprising transitioning the digital logic system from the operational mode to the BIST mode.

13. The method of claim 9, further comprising transitioning the digital logic system from the BIST mode to the operational mode.

14. The method of claim 9, further comprising initializing the digital logic system in the operational mode with the initial state.

15. The method of claim 14, further comprising selecting the operational mode by using a control line to select a first multiplexer input state.

16. The method of claim 12, wherein the BIST sequence applies a digital pattern sequence to a plurality of scan chain inputs to obtain a response at a plurality of scan chain outputs.

17. The method of claim 16, wherein the response is compared to a predetermined reference response to generate a comparison, and wherein the comparison is used for fault detection in the digital logic system.

18. The method of claim 17, wherein the restore directive restores the initial state to the digital logic system.

19. The method of claim 17, wherein the restore directive restores a mirrored version of the initial state to the digital logic system.

20. The method of claim 19, further comprising recovering the initial state from the mirrored version of the initial state by executing the save directive and the restore directive a second time.

* * * * *